US011762128B2

(12) United States Patent
Castellon Rivera et al.

(10) Patent No.: US 11,762,128 B2
(45) Date of Patent: Sep. 19, 2023

(54) METHOD FOR PRODUCING AN APERTURE ARRAY FOR A MICROLENS ARRAY

(71) Applicant: Hella GmbH & Co. KGaA, Lippstadt (DE)

(72) Inventors: William Castellon Rivera, Wadersloh (DE); Benjamin Willeke, Paderborn (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 17/526,795

(22) Filed: Nov. 15, 2021

(65) Prior Publication Data

US 2022/0075099 A1 Mar. 10, 2022

Related U.S. Application Data

(63) Continuation of application No. PCT/EP2020/061135, filed on Apr. 22, 2020.

(30) Foreign Application Priority Data

May 17, 2019 (DE) ..................... 10 2019 113 054.9

(51) Int. Cl.
*G02B 3/00* (2006.01)
*F21S 41/275* (2018.01)
(Continued)

(52) U.S. Cl.
CPC .......... *G02B 3/0012* (2013.01); *F21S 41/275* (2018.01); *F21V 5/004* (2013.01);
(Continued)

(58) Field of Classification Search
None
See application file for complete search history.

(56) References Cited

U.S. PATENT DOCUMENTS 4,952,026 A * 8/1990 Bellman ............... G02B 3/0068
257/E31.127
8,228,417 B1 * 7/2012 Georgiev ............... G03B 11/00
359/368

(Continued)

FOREIGN PATENT DOCUMENTS

DE 3934301 A1 4/1990
DE 102009034532 A1 2/2011
(Continued)

OTHER PUBLICATIONS

International Search Report dated Jul. 20, 2020 in corresponding application PCT/EP2020/061135.
(Continued)

*Primary Examiner* — Ashok Patel
(74) *Attorney, Agent, or Firm* — Muncy, Geissler, Olds & Lowe, P.C.

(57) ABSTRACT

A method for producing an aperture array for a microlens array, in particular for a microlens array of a vehicle headlamp, comprising at least the following steps: providing a wafer having a microlens array arranged on a first wafer surface, masking a second wafer surface of the wafer by means of a shadow mask, wherein the shadow mask includes a negative of the aperture array, coating the masked wafer surface with an opaque layer, removing the shadow mask and obtaining the aperture array on the second wafer surface.

11 Claims, 3 Drawing Sheets

(51) Int. Cl.
*F21V 5/00* (2018.01)
*G03F 7/20* (2006.01)
*G03F 7/00* (2006.01)
*H01L 27/146* (2006.01)

(52) U.S. Cl.
CPC ....... *G02B 3/0056* (2013.01); *G03F 7/70291* (2013.01); *H01L 27/14627* (2013.01)

(56) References Cited

U.S. PATENT DOCUMENTS

| | | | |
|---|---|---|---|
| 9,951,919 | B2 | 4/2018 | Bauer et al. |
| 10,612,741 | B2 | 4/2020 | Moser et al. |
| 10,746,369 | B2 | 8/2020 | Gehb et al. |
| 10,954,591 | B2 | 3/2021 | Leib et al. |
| 2011/0233383 | A1* | 9/2011 | Oku .................. H01L 27/14685 29/428 |
| 2012/0070785 | A1* | 3/2012 | Lee ........................ C08J 7/0427 427/510 |

FOREIGN PATENT DOCUMENTS

| | | |
|---|---|---|
| DE | 102016204344 A1 | 9/2017 |
| JP | H11344602 A | 12/1999 |
| WO | WO2015058227 A1 | 4/2015 |
| WO | WO2017066818 A1 | 4/2017 |

OTHER PUBLICATIONS

Decker et al; "Novel Low Pressure Sputtering Source and Improved Vacuum Deposition of Small Patterned Features Using Precision Shadow Masks" 59th Annual Technical Conference Proceedings, Jan. 1, 2016.

* cited by examiner

METHOD FOR PRODUCING AN APERTURE ARRAY FOR A MICROLENS ARRAY

This nonprovisional application is a continuation of International Application No. PCT/EP2020/061135, which was filed on Apr. 22, 2020, and which claims priority to German Patent Application No. 10 2019 113 054.9, which was filed in Germany on May 17, 2019, and which are both herein incorporated by reference.

BACKGROUND OF THE INVENTION

Field of the Invention

The present invention relates to a method for producing an aperture array for a microlens array, in particular for a microlens array of a vehicle headlamp.

Description of the Background Art

Today, microlens arrays have a wide variety of applications in both imaging and illuminating optical systems. Microlens arrays are constructed of a multiplicity of microlenses arranged side by side whose diameter is typically on the order of magnitude of 10 µm to 1 mm. In modern vehicle headlamps, microlens arrays are used in the projection devices of the light modules, in particular because the microlenses have significantly smaller focal lengths and dimensions than conventional optics so that the overall depth of the projection device can be advantageously small.

For example, WO 2015/058227 A1 discloses a microprojection lighting module for a motor vehicle headlamp having a projection device comprising an array of micro entry optics and an associated array of micro exit optics, wherein the optics are designed and arranged relative to one another such that all of the light emerging from one micro entry optical system enters only exactly one associated micro exit optical system. The disclosed lighting module advantageously comprises an aperture device between the entry and exit optics, by which means the emerging light output is clipped in order to be able to produce a light distribution with defined shapes, for example a sharp light/dark boundary. It is proposed to design the aperture device as a separate component in the form of a perforated mask made of a film or a metal.

In addition, WO 2017/066818 A1 discloses a projection device based thereupon that has, between the aperture device and the exit optics, a second aperture device that fulfils the function of an aperture stop and prevents crosstalk between adjacent microoptics. It is proposed to design the aperture devices as metal perforated masks or to produce them through selective carbonization of the optical bodies by means of laser or electron beams or by the application of an absorbent layer that is then selectively removed again, for example by means of laser beams.

Furthermore, apertures for microlens arrays are produced in the prior art by means of photolithographic structuring of opaque layers. In this process, a full-area coating, for example a metallic thin film, is first applied to the back of a wafer carrying the microlens array and is then provided with a photoresist. An exposure mask, which has a positive or a negative of the aperture array depending on the photoresist type, is positioned thereon, and is exposed to light. The photoresist is then locally removed in a wet chemical process so that the photoresist layer reproduces a positive of the aperture array and exposes sections of the opaque layer located below it. These exposed sections of the layer are thereupon removed by means of an etching process, for example by means of ion beam etching, while the structured photoresist protects the adjacent layer sections from removal. Finally, the remaining photoresist is removed in a further wet chemical process, ultimately exposing the aperture array on the wafer surface.

Among the aforementioned methods for producing aperture arrays, photolithographic structuring, as a standard process from semiconductor technology, should be considered the most robust and economical manufacturing route. Its disadvantage is the high number of process steps involved, causing the production of the aperture arrays to contribute to an undesirable degree to the total expenditure of labor and costs in producing a projection device based on microlens arrays.

SUMMARY OF THE INVENTION

It is therefore an object of the present invention to provide a method for producing an aperture array for a microlens array that represents an economical and less labor-intensive alternative to prior art methods.

The invention includes the technical teaching that the production method can include the following steps: providing a wafer having a microlens array arranged on a first wafer surface, masking a second wafer surface of the wafer by means of a shadow mask, wherein the shadow mask includes a negative of the aperture array, coating the masked wafer surface with an opaque layer, removing the shadow mask and obtaining the aperture array on the second wafer surface.

The invention is based on the concept of combining the process steps of layer deposition and structuring, which are separate in the prior art, by the means that, during layer deposition, a shadow mask arranged on the wafer surface masks the sections of the wafer surface intended as aperture openings and consequently protects them from being coated with the opaque layer. As a result, the method according to the invention avoids the lithography and etching steps, which are common in the prior art, thus reducing the overall process complexity and the total production costs.

With regard to the product quality that can be achieved with the method according to the invention, it should additionally be noted that the wafer surface retains an as-manufactured surface quality in the region of the aperture openings, since it is masked during the coating process. With the photolithographic route according to the prior art, in contrast, the regions of the (later) aperture openings are first coated and then exposed again by means of an etching process. This process management adversely affects the surface quality, of course, in particular an increase in roughness parameters is characteristic, so that a degradation of the luminous efficiency of the projection device ultimately results on account of increased light scattering during passage through the aperture opening that is roughened in this way.

In an advantageous embodiment of the method according to the invention, an opaque layer of a metal or metal alloy, in particular chromium, is deposited during coating of the masked wafer surface. Metals are characterized by a high absorption coefficient for electromagnetic radiation in the relevant visual spectral range and, moreover, are robust against heating in operation of the light modules.

Preferably, the layer thickness of the opaque layer deposited during coating of the masked wafer surface is 50 nm to 500 nm, in particular 100 nm to 200 nm. These are typical values for the use of metallic layers. Such layer thicknesses can be deposited in short process times, and do not bring about any appreciable increase in the overall depth of the projection device as a whole.

The coating of the masked wafer surface is preferably carried out by means of a physical vapor deposition (PVD) method. In connection with the use according to the invention of a shadow mask, PVD methods have the advantage of a geometrically directed coating process in which a particle beam strikes the wafer surface at a defined angle of incidence. Consequently, in the case of perpendicular incidence of the particle beam on the wafer, and thus also on the shadow mask, it is possible to minimize shadowing effects due to the mask edges as well as creepage of coating material into the masked sections of the wafer surface.

Furthermore, a shadow mask with an aperture array negative is preferably used during masking, wherein a characteristic length of a negative of an individual aperture is 0.1 mm to 5 mm in each case. This order of magnitude is matched to the diameter of the individual lenses that are typically used in microlens arrays for projection devices of vehicle headlamps. In particular, such feature sizes can be produced without difficulty using the deposition according to the invention in a shadow mask.

The present invention additionally relates to an assembly for a vehicle headlamp comprising at least a microlens array and an aperture array, wherein the aperture array is produced by means of one of the aforementioned embodiments of the method according to the invention.

In particular, the assembly includes two microlens arrays and an aperture array arranged between them, wherein the aperture array is arranged as a field stop array in the focal plane of the second microlens array in order to create a well-defined light distribution.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

FIGS. 1a-1d illustrate the individual steps 100, 200, 300, and 400 of the production method according to the invention. The references to reference symbols given in the following description of the individual figures each become clear in viewing FIG. 1a-1d as a whole.

Figure 1A:
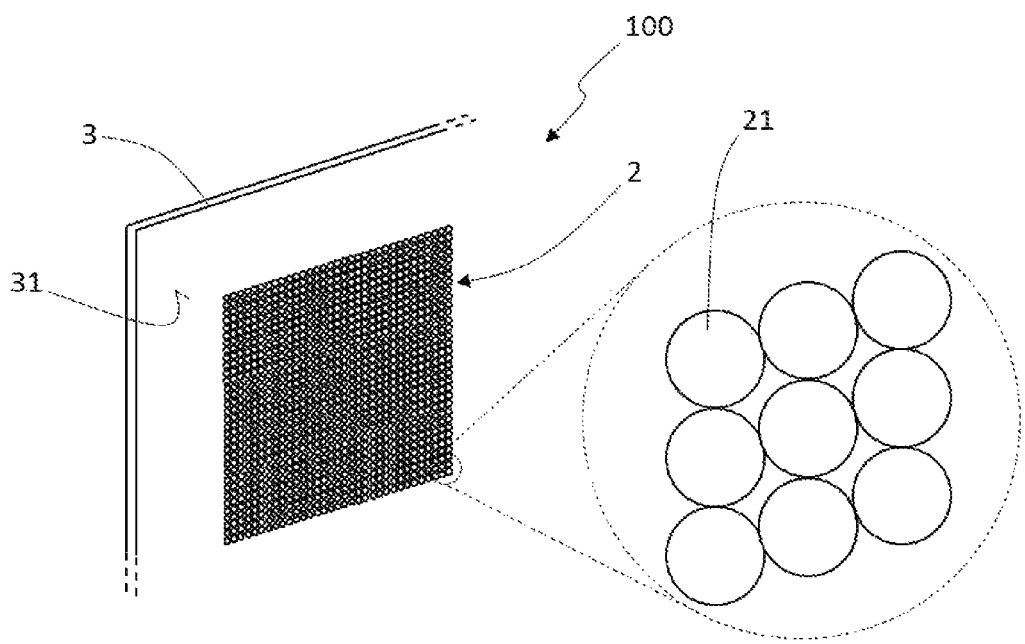
FIG. 1a-1d are illustrations of the steps of the method according to the invention.

FIG. 1a shows the providing 100 of a wafer 3 having a microlens array 2 arranged on a first wafer surface 31. Depicted is a detail of the wafer 3 and of the microlens array 2, as well as an enlarged detail view of the arrangement of individual lenses 21 of the microlens array 2. The wafer 3 is preferably made of quartz glass or of a transparent polymer, and has a thickness of typically 0.2 mm to 2.5 mm. The microlens array 2 may have been manufactured by reflow processes, molding from UV-curing polymer, UV reaction injection molding, etching in glass, embossing, printing, using a plastic compression molding process, by injection molding, and/or by a molding technique with negative molds. The shape of the microlens array 2 is rectangular, for example, with typical dimensions of the long side from 10 mm to 100 mm and of the short side from 5 mm to 20 mm. The individual lenses 21 constituting the array have a horizontal and vertical pitch of typically 0.1 mm-0.5 mm, but can also have diameters up to 5 mm in special cases. The arrangement of the individual lenses 21 can span a square grid as shown in FIG. 1a, for example, but alternatively a hexagonal arrangement can also be advantageous, for example.

Figure 1B:
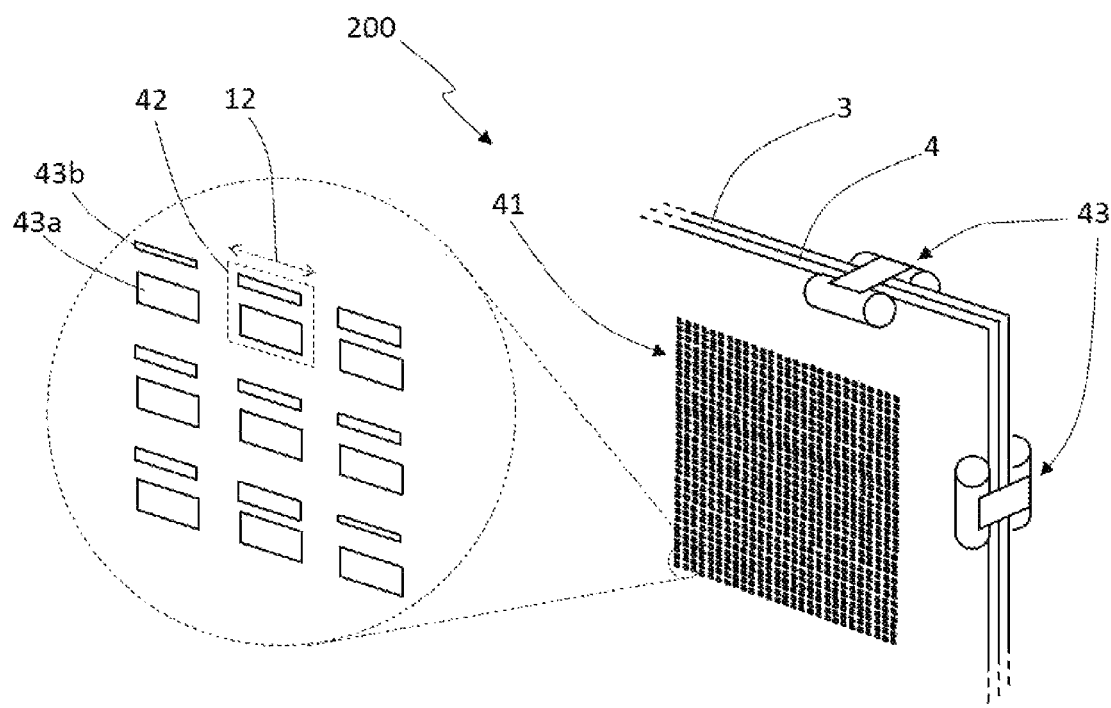

FIG. 1b represents the masking 200 of the second wafer surface 32 of the wafer 3 by means of the shadow mask 4, which includes a negative 41 of the aperture array 1. The shadow mask 4 is made, for example, of a high-precision structured metal sheet, a microperforated film, or a plastic or glass plate. The shadow mask 4 in this case must be positioned highly precisely on the wafer surface 32 in order to ensure that the negative 41 is aligned exactly with the microlens array 2 on the opposite wafer surface 31. The thickness of the shadow mask 4 is selected to be as small as possible in order to avoid undesirable shadowing effects in the shadow mask 4 during coating 300. The enlarged detail view of the shadow mask 4 shows that each of the individual negatives 42 has two rectangular openings 43a, 43b that correspond to the later aperture frames 13a, 13b of the aperture array 1. The length 12 of the negatives 42 or of the individual apertures 11 is usefully matched to the diameter of the microlenses 21. In order to ensure a maximally full-area and gap-free contact between the shadow mask 4 and the wafer 3, the clip-like clamping devices 43 are mounted on the edge around the mask 4 and wafer 3. For example, it is additionally possible for the shadow mask 4 to be made of a ferromagnetic metal, such as nickel, so that the shadow mask 4 can be pressed onto the wafer surface 32 that is to be coated by means of a magnet arranged on the opposite wafer surface 31.

Figure 1C:
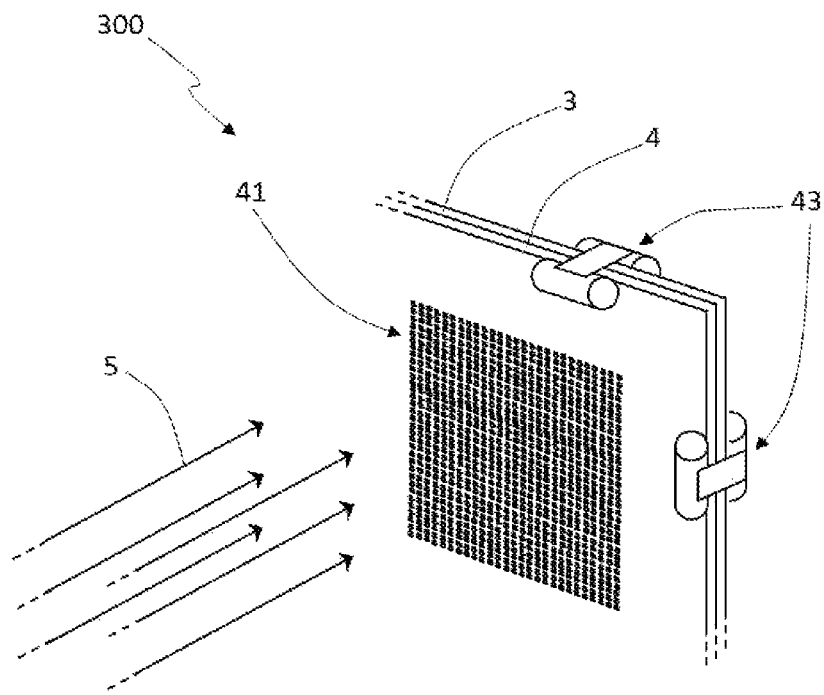

FIG. 1c shows the coating 300 of the wafer surface 32 that is masked with the shadow mask 4. For this purpose, a PVD process is advantageously used, in particular a sputtering method (cathode sputtering), that creates the directed particle beams 5 of the coating material to be deposited. The incidence of the particle beams 5 on the shadow mask 4 is oriented essentially perpendicularly in this case so that undesirable shadowing effects due to the edges of the openings 43a, 43b of the negative 41 do not occur, but instead the wafer surface 32 under the openings 43a, 43b is homogeneously coated over its full area. Due to the perpendicular incidence of the particle beams 5, moreover, penetration of coating material into any gaps between the shadow mask 4 and the wafer surface 32 is reduced. Chromium, which is distinguished by a high specific absorptivity and high durability, is advantageously used as the coating material for forming the opaque layer.

Figure 1D:
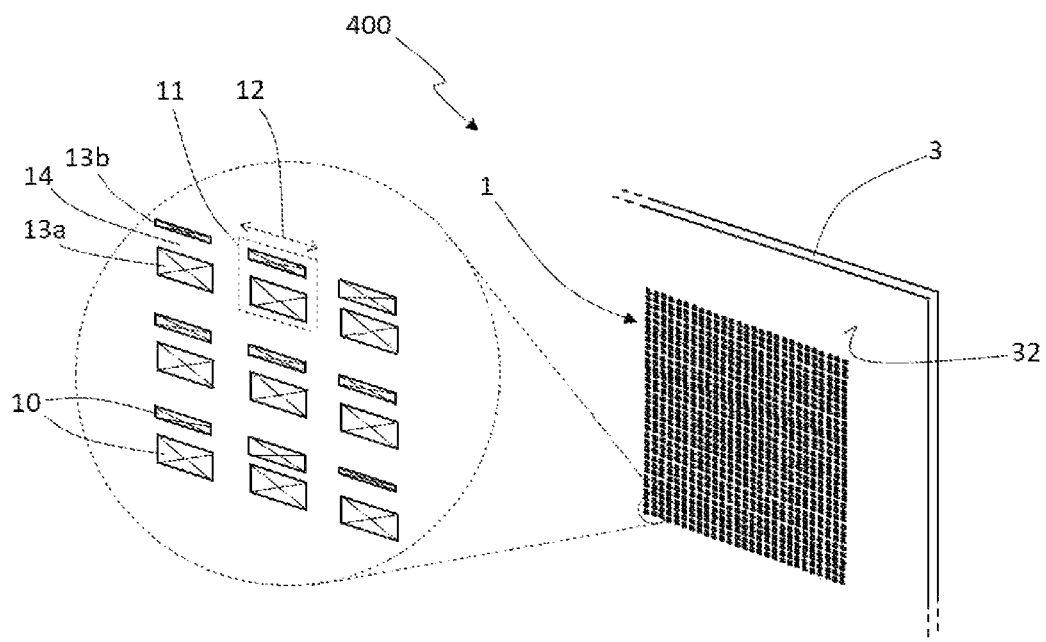

FIG. 1d shows the aperture array 1 on the wafer surface 32 after the removing 400 of the shadow mask 4. The individual apertures 11 forming the aperture array 1 each include the two rectangular aperture frames 13a and 13b, which are made of the opaque chromium layer 10. The length 12 of the individual apertures 11 corresponds approximately to the diameter of the individual lenses 21 of the microlens array 2. Located between the aperture frames 13a, 13b in each case is the aperture opening 14, through which the light output of the light modules passes in headlamp operation. In the case shown here, the area of the respective aperture frames 13b varies, and the size of the aperture openings 14 varies accordingly. When the aperture array 1 is used as an array of field stops for clipping the light output, a variation of this nature in the size and/or even the shape of the various aperture openings 14 represents an elegant option for detailed definition of the light distribution projected by the projection device, namely with respect to both its contour and the local beam intensity.

Figure 2:
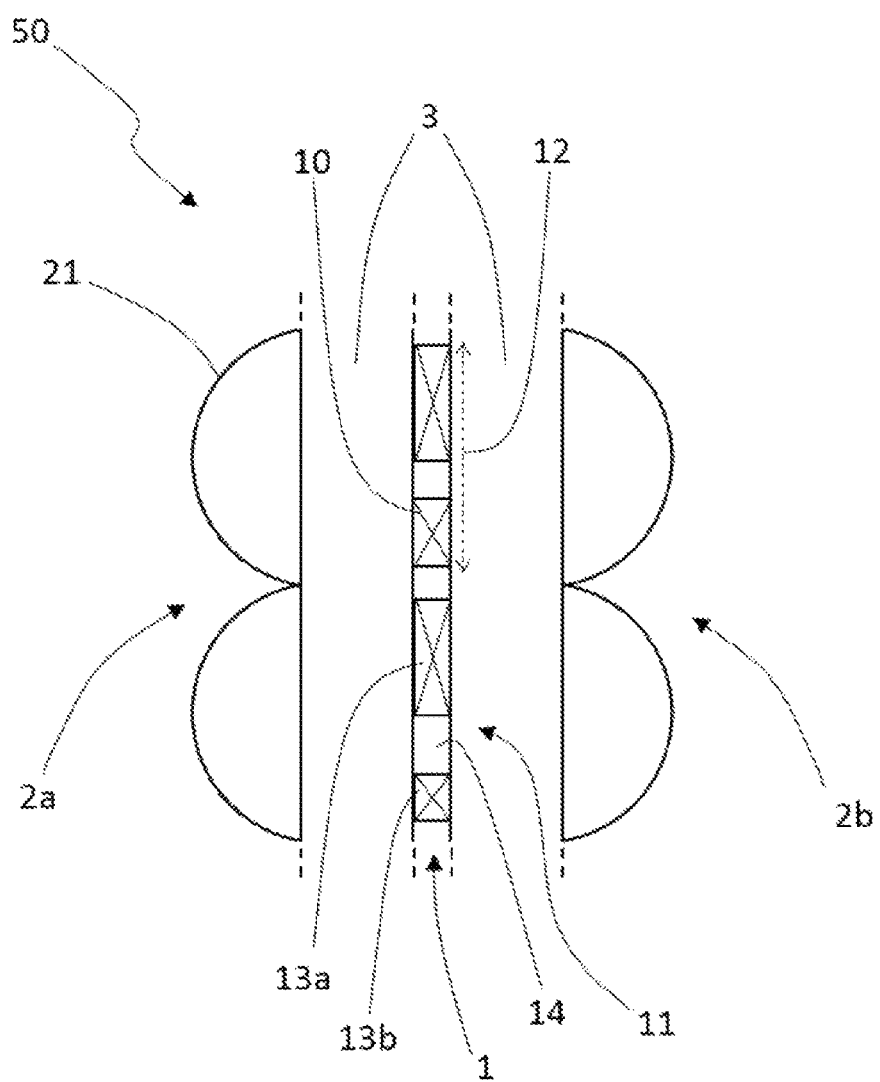
FIG. 2 is a cross-sectional view of an assembly according to the invention.

FIG. 2 shows a cross-sectional view of a section of an assembly 50 according to the invention comprising the first and second microlens arrays 2a and 2b on opposite surfaces of the two transparent wafers 3 and the aperture array 1 arranged between them that was deposited on one of the wafer surfaces by means of the method according to the invention. The depiction is not to scale, but instead the thickness of the wafer 3 in practice is approximately 1 mm, the thickness of the chromium layer 10 constituting the aperture array 1 is approximately 100 nm, and the thickness of the individual lenses 21 as well as the characteristic length 12 of the individual apertures 11 is, for example, 250 µm to 500 µm. The two wafers 3 are permanently joined together, for example by an adhesive bond extending continuously around the edges, or alternatively covering the full area. When used in a projection device of a vehicle headlamp, the microlens array 2a functions as, for example, the entry optics for light emitted by the light source, and the other microlens array 2b serves as the exit optics for projecting a light distribution onto the roadway. In the example shown here, the aperture array 1 fulfils the function of a field stop array, i.e., the aperture array is positioned in the focal plane of the second microlens array 2b and is therefore projected sharply onto the roadway by the microlens array 2b functioning as the exit optics. In the case of an arrangement of the assembly 50 in a headlamp such that the aperture frames 13a and 13b of the individual apertures 11 are located vertically one above the other as shown in FIG. 2, the projection of the lower edges of all aperture frames 13a forms a sharp light/dark boundary on the roadway, provided that all aperture frames 13a take on the same dimensions and the same position within the individual apertures 11. The variation of the dimensions of the relevant aperture frames 13b then serves to shape the light field projected below the light/dark boundary. In addition, the assembly 50 shown in FIG. 2 can be further supplemented by a second aperture array, likewise produced by means of the method according to the invention, that is arranged between the field stop array 1 and the microlens array 2b functioning as the exit optics, and that carries out the function of an aperture stop array for suppression of scattered light.

The invention is not limited in its implementation to the preferred exemplary embodiment provided above. Instead, a number of variants are possible that make use of the described solution even in embodiments that are fundamentally different in nature. All features and/or advantages, including design details, spatial arrangements, and method steps, that derive from the claims, the description, or the drawings, can be essential for the invention individually as well as in a wide variety of combinations.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing an aperture array for a microlens array, the method comprising:
   providing a wafer having a first wafer surface and an opposing second wafer surface and arranging a microlens array on the first wafer surface;
   providing a masked wafer surface by arranging a shadow mask on the second wafer surface of the wafer, the shadow mask including a negative of the aperture array to be formed, such that the shadow mask covers sections of the second wafer surface in locations that correspond to aperture openings of the aperture array to be formed and the shadow mask includes openings in locations that correspond to aperture frames of the aperture array to be formed;
   coating the masked wafer surface with an opaque layer so that the opaque layer is deposited on the second wafer surface via the openings of the shadow mask to form the aperture frames of the aperture array and the opaque layer is not deposited on the sections of the second wafer that are covered by the shadow mask so as to form the aperture openings; and
   removing the shadow mask to obtain the aperture array on the second wafer surface, the aperture array including the aperture frames formed by the opaque layer and the aperture openings provided between the aperture frames.

2. The method according to claim 1, wherein the opaque layer is made of a metal or metal alloy.

3. The method according to claim 2, wherein the opaque layer is made of chromium.

4. The method according to claim 1, wherein the opaque layer has a layer thickness of 50 nm to 500 nm.

5. The method according to claim 1, wherein the coating of the masked wafer surface is carried out by a physical vapor deposition method.

6. The method according to claim 1, wherein a length of a portion of the shadow mask that corresponds to an individual aperture of the aperture array to be formed is 0.1 mm to 5 mm.

7. An assembly for a vehicle headlamp comprising at least one microlens array and an aperture array, wherein the aperture array is produced by the method according to claim 1.

8. The assembly according to claim 7, wherein the at least one microlens array includes a first microlens array and a second microlens array, wherein the aperture array is arranged between the first and second microlens, wherein the aperture array is arranged as a field stop array in a focal plane of the second microlens array.

9. The method according to claim 1, wherein the microlens array is a microlens array of a vehicle headlamp.

10. The method according to claim 4, wherein the opaque layer has a layer thickness of 100 nm to 200 nm.

11. The assembly according to claim 7, wherein the first microlens array is arranged on a first wafer and the second microlens is arranged on a second wafer, the aperture array being provided between the first and second wafers.

* * * * *